US010843221B2

(12) United States Patent
Wollin

(10) Patent No.: US 10,843,221 B2

(45) Date of Patent: Nov. 24, 2020

(54) SYSTEM AND METHOD FOR A COATING DEVICE

(71) Applicant: THE BOEING COMPANY, Chicago, IL (US)

(72) Inventor: Alex Joseph Wollin, Bothell, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/182,194

(22) Filed: Nov. 6, 2018

(65) Prior Publication Data

US 2020/0139398 A1 May 7, 2020

(51) Int. Cl.

*B05C 17/02* (2006.01)
*C23C 16/458* (2006.01)
*B05D 1/28* (2006.01)

(52) U.S. Cl.

CPC .......... *B05C 17/024* (2013.01); *B05C 17/023* (2013.01); *B05D 1/28* (2013.01)

(58) Field of Classification Search

CPC ....... B05D 1/28; B05C 17/023; B05C 17/024; C23C 16/458; C23C 16/4584; C23C 16/4588

See application file for complete search history.

(56) References Cited

U.S. PATENT DOCUMENTS 1,085,234 A 1/1914 Allan
6,158,196 A * 12/2000 Trebbi .................. B67B 3/2033 53/317
6,702,038 B1 3/2004 Sedlacek et al.
7,343,947 B1 * 3/2008 Sollami ................. E21C 35/197 144/241
7,390,533 B2 6/2008 Krueger
8,065,774 B2 11/2011 Schiesz et al.
2003/0002932 A1 * 1/2003 Eriksson ................. B23B 51/02 408/1 R
2003/0049086 A1 * 3/2003 Cavanaugh ............... B23C 5/14 409/234
2003/0137185 A1 * 7/2003 Sollami ................. E21C 35/197 299/106
2005/0141975 A1 * 6/2005 Hardesty .................. B23Q 5/04 409/201
2007/0014647 A1 * 1/2007 Watzke ................... B23B 31/02 409/136
2007/0297273 A1 * 12/2007 Urbanek ............. B29C 45/5008 366/78
2008/0022486 A1 * 1/2008 Burlington ................ A47L 5/22 15/412

(Continued)

OTHER PUBLICATIONS

Cooley, Christopher G., et al., "A Review of Planetary and Epicyclic Gear Dynamics and Vibrations Research". Applied Mechanics Reviews, Jul. 2014, vol. 66, 040804, pp. 1-15.*

(Continued)

*Primary Examiner* — Bret P Chen

(74) *Attorney, Agent, or Firm* — Armstrong Teasdale LLP

(57) ABSTRACT

A rotatable tool assembly including a motor and a tool assembly operatively coupled to the motor. The tool assembly includes an epicyclic gear system rotatably coupled to the motor and one or more tools rotatably coupled to the epicyclic gear system. The motor is configured to rotate the epicyclic gear system, and the epicyclic gear system is configured to rotate the tool.

18 Claims, 8 Drawing Sheets

(56) References Cited

U.S. PATENT DOCUMENTS

| | | | | |
|---|---|---|---|---|
| 2010/0006605 | A1* | 1/2010 | Sung | B05C 17/0103 222/327 |
| 2014/0305862 | A1* | 10/2014 | Zur | B01D 33/37 210/333.01 |

OTHER PUBLICATIONS

Sutar, S.S., et al., "Torque Measurement in Epicyclic Gear Train". International Journal of Engineering and Advanced Technology (IJEAT) ISSN: 2249-8958, vol. 5, Issue-6, Aug. 2016, pp. 185-188.*

* cited by examiner

SYSTEM AND METHOD FOR A COATING DEVICE

FIELD

The field of the disclosure relates generally to coating devices and, more specifically, to a system and method for a rotatable coating device with an epicyclic gear system.

BACKGROUND

Large machines, such as aircraft, typically include thousands of fasteners holding a skin of a fuselage in place. The skin of the fuselage is typically made of metal sheets, usually aluminum or carbon composite sheets, attached to a frame by the fasteners. The fasteners are typically bolts that extend through the frame and the metal sheets. As such, at least a portion of the fasteners are exposed to the elements and need protection from corrosion. The fasteners are typically coated with a primer and/or a paint in order to protect them from corrosion. At least one method of coating the fasteners is to paint and/or prime them by hand using a brush and a jar of paint and/or primer. However, coating by hand is slow, requires a large workforce, and is expensive. Another method of priming and/or painting the fasteners is to spray them with a spraying device. However, regulations may make spraying paints and/or primers more expensive.

This Background section is intended to introduce the reader to various aspects of art that may be related to the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect of the present disclosure includes a rotatable tool assembly including a motor and a tool assembly operatively coupled to the motor. The tool assembly includes an epicyclic gear system rotatably coupled to the motor and one or more tools rotatably coupled to the epicyclic gear system. The motor is configured to rotate the epicyclic gear system, and the epicyclic gear system is configured to rotate the tool.

Another aspect of the present disclosure includes a disposable tool assembly removably coupled to a motor. The disposable tool assembly includes an epicyclic gear system and one or more tools rotatably coupled to the epicyclic gear system. The epicyclic gear system is configured to rotate the tool.

Yet another aspect of the present disclosure includes a method of coating a component with a rotatable tool assembly. The rotatable tool assembly includes a motor and a tool assembly. The tool assembly includes an epicyclic gear system rotatably coupled to the motor and one or more tools rotatably coupled to the epicyclic gear system. The method includes coupling the tool assembly to the motor. The method also includes contacting the component with the one or more tools. The method further includes activating the motor. Activating the motor simultaneously rotates the epicyclic gear system and dispenses a coating material on the one or more tools Various refinements exist of the features noted in relation to the above-mentioned aspects. Further features may also be incorporated in the above-mentioned aspects as well.

These refinements and additional features may exist individually or in any combination. For instance, various features discussed below in relation to any of the illustrated examples may be incorporated into any of the above-described aspects, alone or in any combination.

BRIEF DESCRIPTION OF THE DRAWINGS

FIG. 3 is a side view of the rotatable tool assembly shown in

FIG. 2;

Although specific features of various examples may be shown in some drawings and not in others, this is for convenience only. Any feature of any drawing may be referenced and/or claimed in combination with any feature of any other drawing.

Unless otherwise indicated, the drawings provided herein are meant to illustrate features of examples of the disclosure. These features are believed to be applicable in a wide variety of systems comprising one or more examples of the disclosure. As such, the drawings are not meant to include all conventional features known by those of ordinary skill in the art to be required for the practice of the examples disclosed herein.

DETAILED DESCRIPTION

Examples of the systems described herein include a rotatable tool for performing tasks such as painting, coating, polishing, or cleaning. The rotatable tool includes a motor and a tool assembly operatively coupled to the motor. The tool assembly includes an epicyclic gear system including a sun gear, a plurality of planet gears, and a ring gear. The tool assembly also includes one or more tools operatively coupled to the epicyclic gear system. The tool assembly is designed to be replaceable and/or disposable such that the motor can operate a plurality of tool assemblies with different tools. Additionally, the tool assembly is design to be quickly detached from the motor and can be cleaned or refurbished for later use. For example, the tools may be buffing and/or polishing tools, screw drivers, drills, and/or any tool that rotates. In an implementation, the one or more tools include one or more rollers coupled to the epicyclic gear system and configured to coat a component with paint and/or primer. Specifically, the rotatable tool is configured to coat fasteners with a paint and/or primer. Each roller is coupled to a planet gear such that the planet gears rotate the rollers as the motor rotates the epicyclic gear system. The tool assembly further includes a shroud at least partially surrounding the epicyclic gear system and the tools. A coating material, such as the primer or paint, is channeled to the shroud and is applied to the rollers by a nozzle positioned within the shroud.

An operator positions the rotatable tool such that the rollers surround the fastener. An operator may be a human operator or may be an automated and/or semi-automated robotic operator (i.e., a robot). The operator then activates the motor which rotates the rollers around the fastener. Activating the motor simultaneously activates the flow of coating material to the nozzle and to the rollers such that the coating material quickly coats the rollers and the fastener. The rotatable tool provides an efficient and cost effective method for coating a plurality of fasteners on large machines, such as aircraft. When used with tools other than the rollers, the rotatable tool provides an efficient and cost effective method for operating a tool that rotates.

Figure 1:
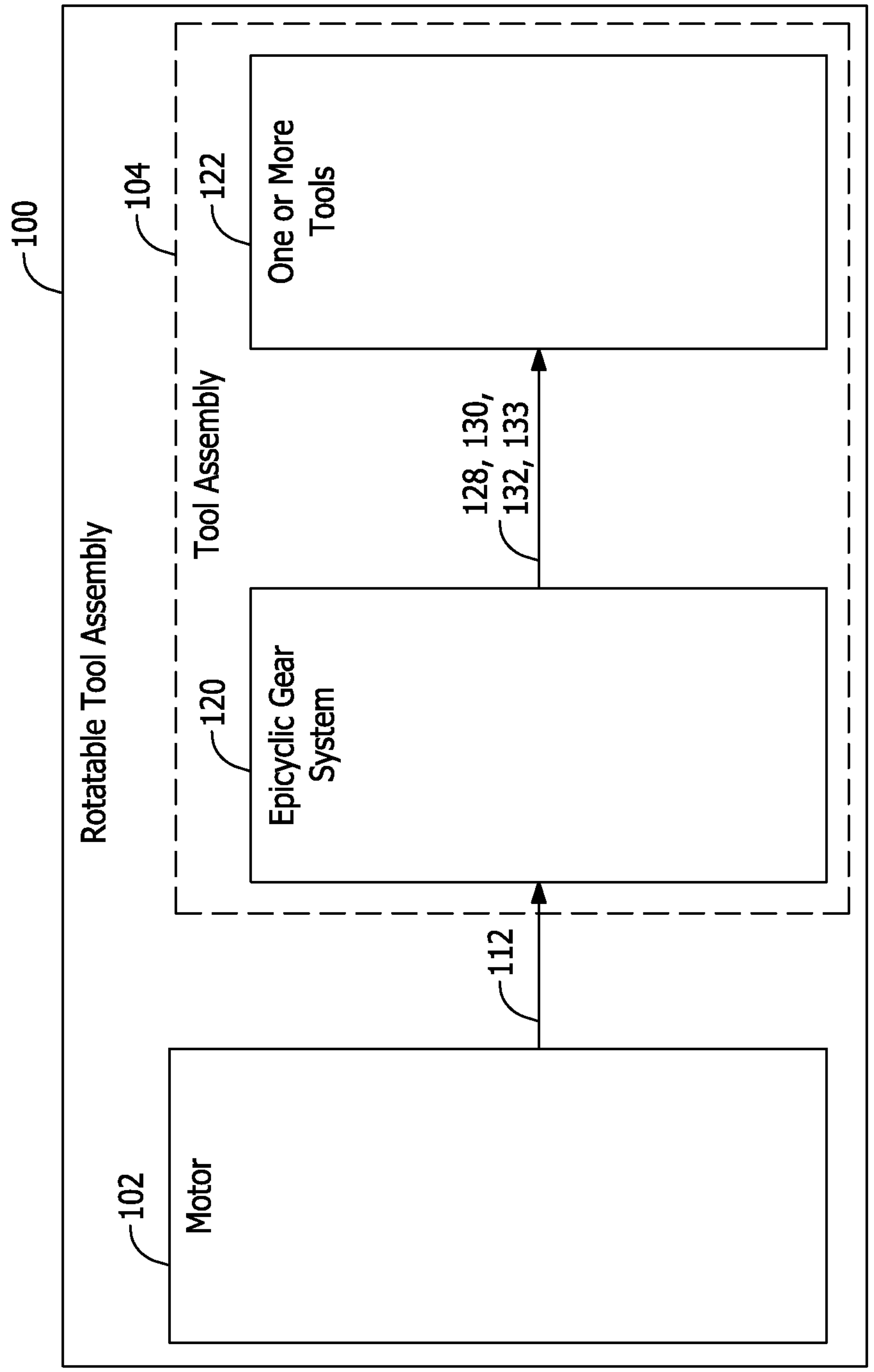
FIG. 1 is a functional block diagram of an example of a rotatable tool assembly.

FIG. 1 is a functional block diagram of an example of a rotatable tool assembly 100. Rotatable tool assembly 100 includes a motor 102 and a tool assembly 104 operatively coupled to motor 102 by an output shaft 112. Tool assembly 104 includes an epicyclic gear system 120 and one or more tools 122 rotatably coupled to epicyclic gear system 120. Specifically, epicyclic gear system 120 includes a sun gear 128, a plurality of planetary gears 130, a ring gear 132, and a carrier 133, and one or more tools 122 is rotatably coupled to at least one of sun gear 128, planetary gears 130, ring gear 132, and/or carrier 133. Tools 122 may include any rotatable tool, such as, without limitation, rollers, buffing and/or polishing tools, screw drivers, drills, machining tools, and/or any tool that rotates. During operation, motor 102 rotates output shaft 112, and output shaft 112 rotates epicyclic gear system 120. Epicyclic gear system 120 then rotates tools 122, which are used to accomplish a rotatable task.

Figure 2:
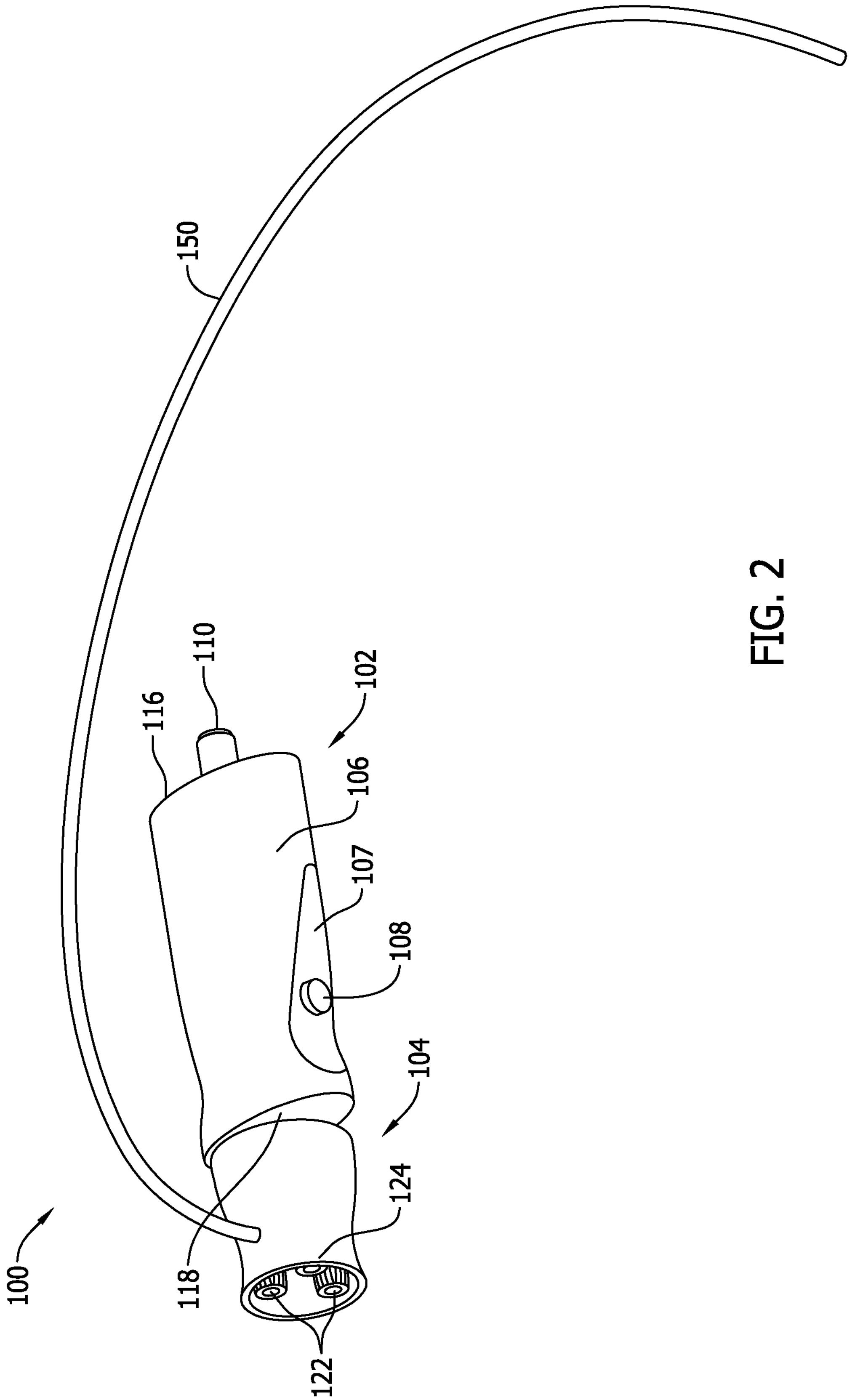
FIG. 2 is a perspective view of an example of a rotatable tool assembly shown in FIG. 1.
Figure 3:
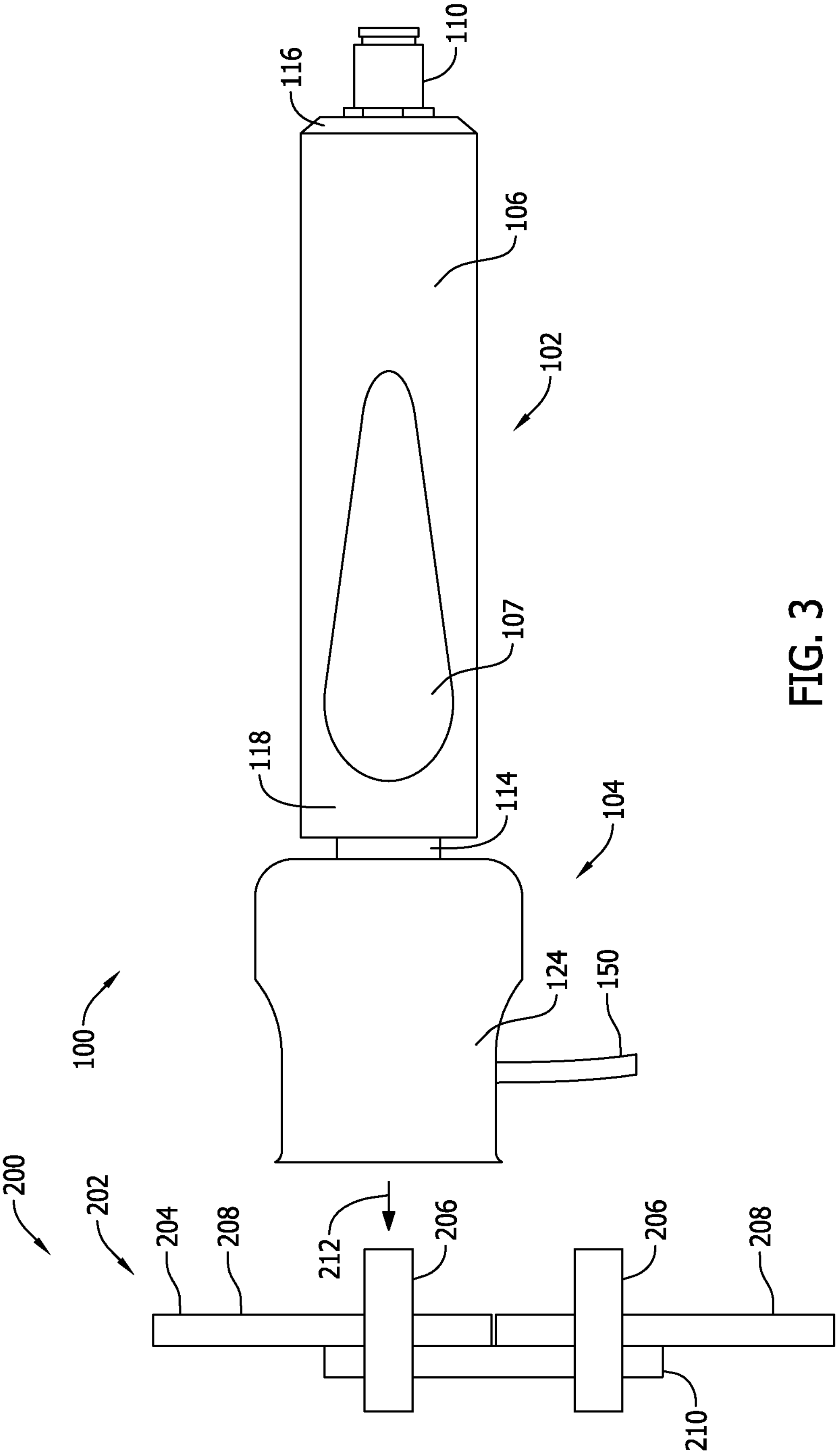
Figure 4:
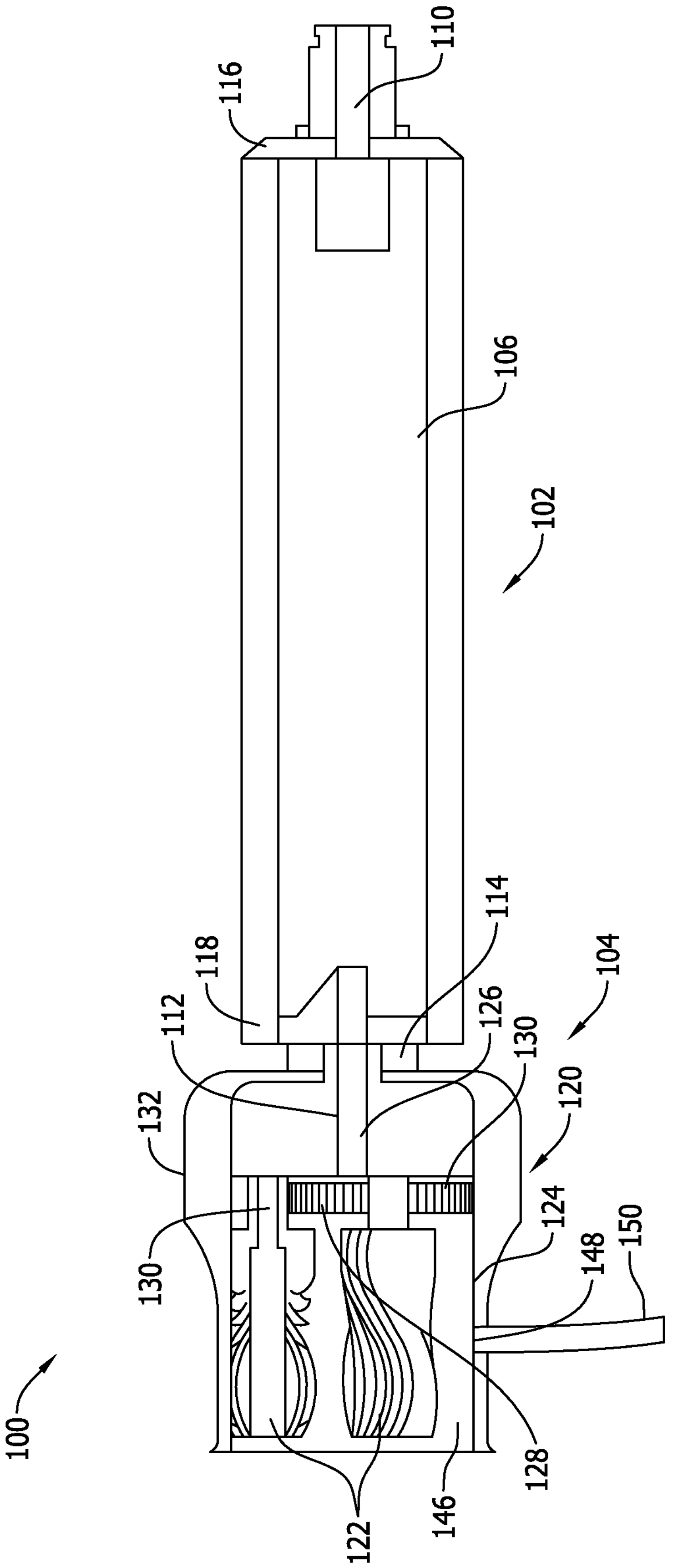
FIG. 4 is a sectional view of the rotatable tool assembly shown in FIG. 2.

FIG. 2 is a perspective view of an example of rotatable tool assembly 100. FIG. 3 is a side view of rotatable tool assembly 100 and a sectional view of a skin 204 of a fuselage 202 of an aircraft 200. FIG. 4 is a sectional view of rotatable tool assembly 100. Rotatable tool assembly 100 includes motor 102 and tool assembly 104 operatively coupled to motor 102. Tool assembly 104 is configured to be replaceable and/or disposable. As such, motor 102 is configured to be operable with multiple tool assemblies 104 depending on the task. For example, in the illustrated implementation, tool assembly 104 is configured to apply a coating material on a plurality of fasteners 206. Specifically, aircraft 200 includes fuselage 202 including skin 204. Fasteners 206 are configured to attach a plurality of metal sheets 208, usually aluminum sheets, to a frame 210 to form skin 204. Fasteners 206 are exposed to the elements and need protection from corrosion. The coating material applied to fasteners 206 protects fasteners 206 from corrosion.

In an alternative implementation, tool assembly 104 may be configured to perform a different task. For example, fuselage 202 of aircraft 200 may require polishing and/or buffing after it has been painted and/or primed. An operator removes tool assembly 104 from motor 102, and replaces tool assembly 104 with a polishing and/or buffing tool assembly (not shown) including a polishing and/or buffing tool (not shown). As such, tool assembly 104 is configured to be removably coupled to motor 102, and motor 102 is configured to be operatively coupled with a plurality of tool assemblies 104 each potentially including a different tool configured to perform a separate function. Using a single motor 102 to operate a plurality of tool assemblies 104 reduces costs, saves space in a manufacturing facility, and increases efficiency.

In the illustrated implementation, motor 102 is a pneumatic motor driven by compressed air. A source of compressed air (not shown), such as a compressor or compressed air system within the manufacturing facility, channels a flow of compressed air to motor 102. The flow of compressed air provides power to motor 102 and drives the pneumatic motor. In alternative implementations, motor 102 may be any type of motor that enables rotatable tool assembly 100 to operate as described herein, including, without limitation, an electric motor.

Motor 102 includes a casing 106, a switch or push-button 108, a hose connector 110, output shaft 112, and a coupling collar 114. Casing 106 encloses motor 102 and includes an ergonomic design configured to allow the operator to comfortably hold rotatable tool assembly 100. Specifically, casing 106 includes two ergonomic indentations 107 configured to allow an operator to comfortably hold rotatable tool assembly 100 during operations. Push-button 108 is configured to activate motor 102. Hose connector 110 is positioned on a first end 116 of motor 102 and is configured to receive and attach a hose (not shown) to motor 102. The hose is configured to channel a flow of compressed air to motor 102. Coupling collar 114 is positioned on a second end 118 of motor 102 opposite first end 116 and is configured to attach tool assembly 104 to motor 102. Output shaft 112 is positioned on second end 118 of motor 102 and extends through coupling collar 114 such that coupling collar 114 circumscribes output shaft 112. Motor 102 is configured to rotate output shaft 112.

Figure 5:
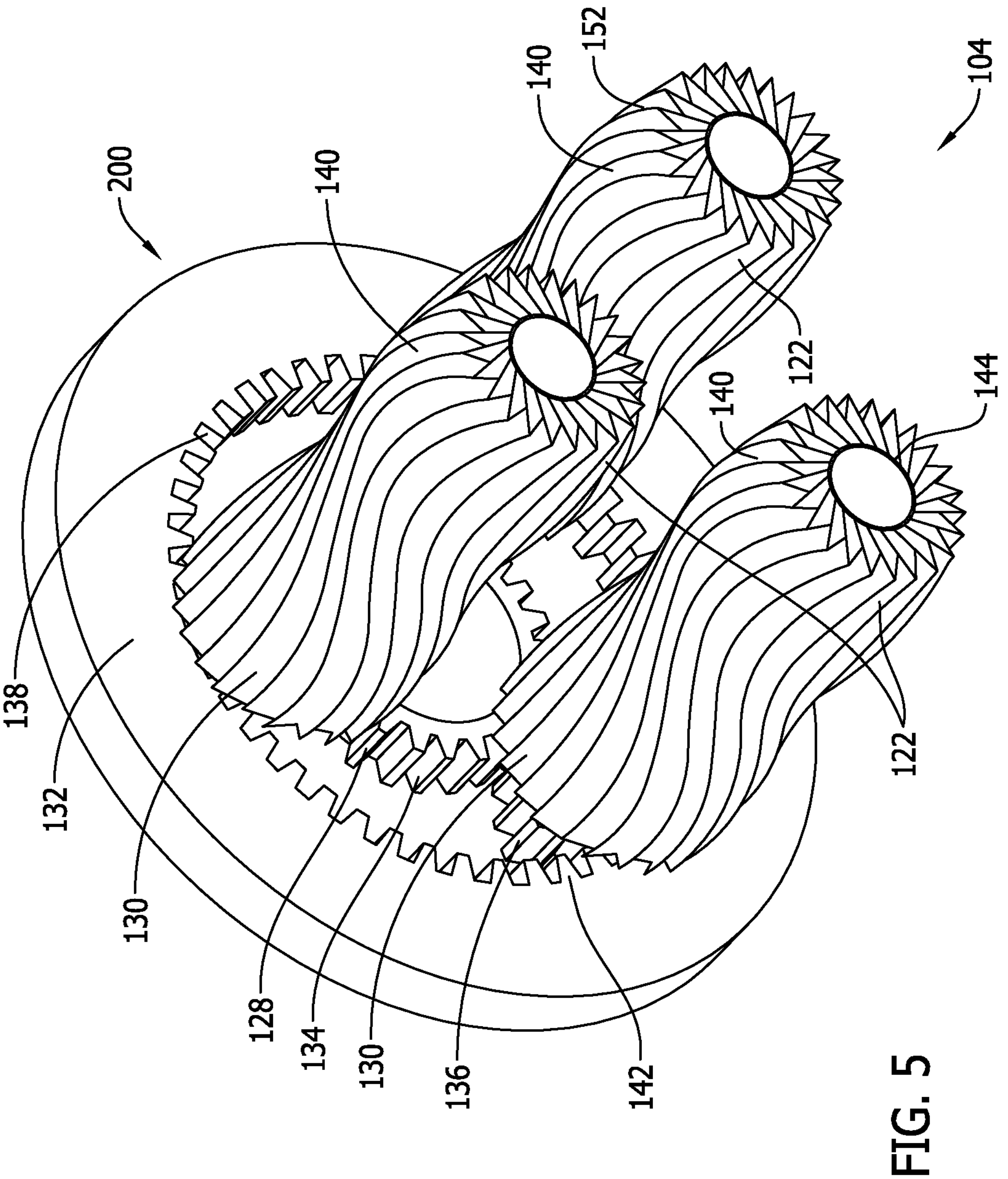
FIG. 5 is a perspective view of a tool assembly for use with the rotatable tool assembly shown in FIG. 2 with a shroud removed.
Figure 6:
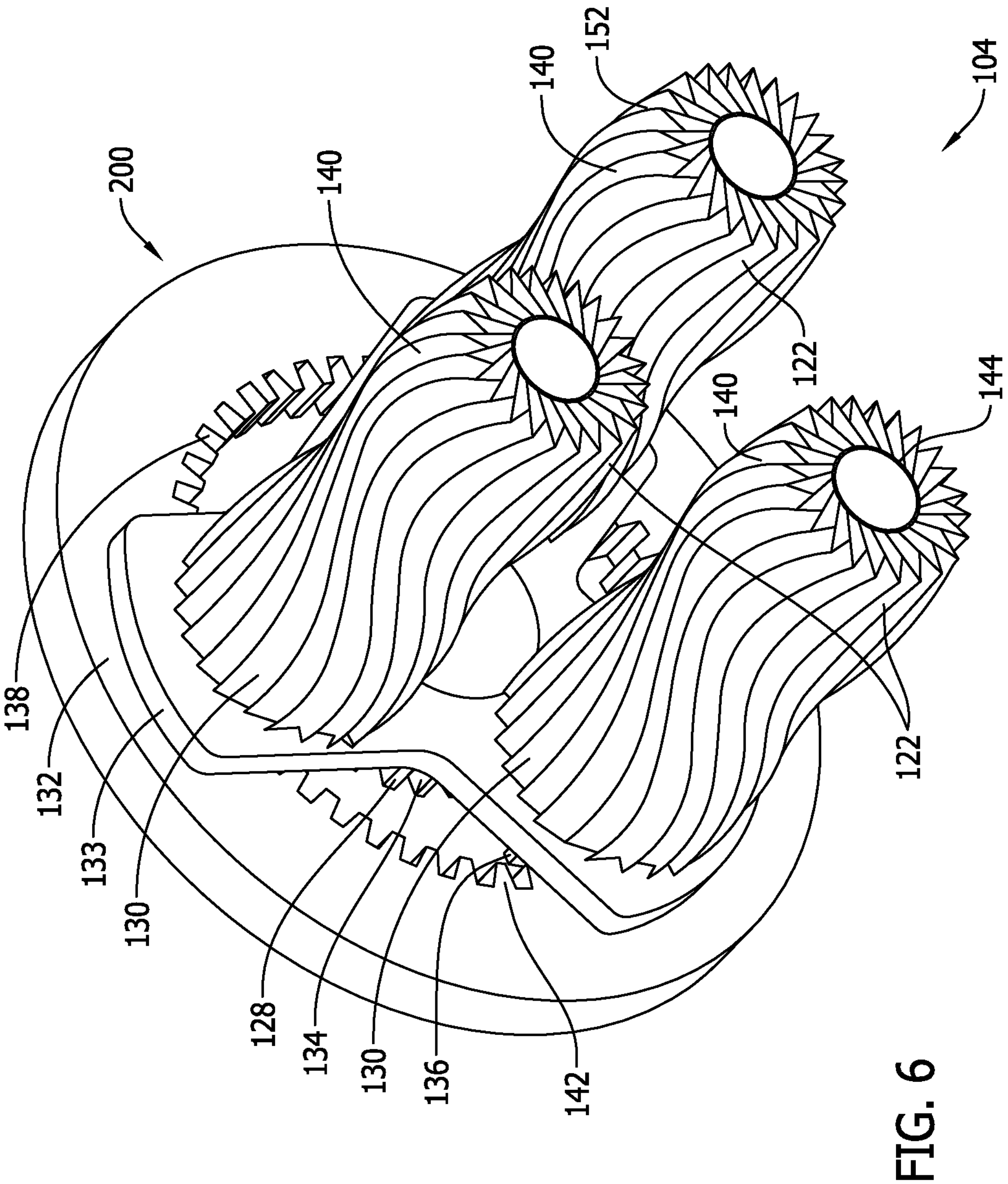
FIG. 6 is a perspective view of a tool assembly with a carrier for use with the rotatable tool assembly shown in FIG. 2 with a shroud removed.
Figure 7:
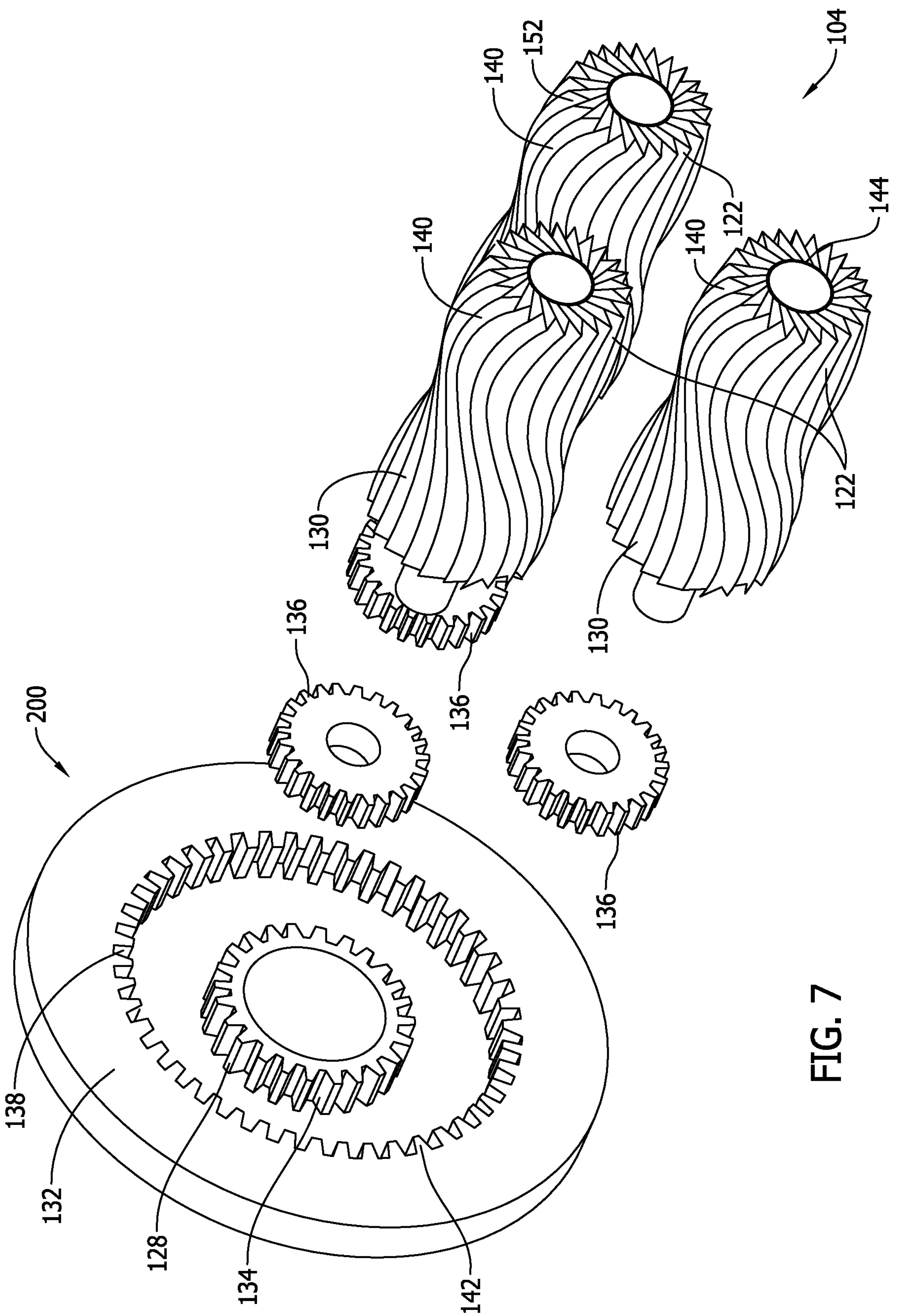
FIG. 7 is an exploded perspective view of a tool assembly for use with the rotatable tool assembly shown in FIG. 2 with a shroud removed.

Tool assembly 104 includes epicyclic gear system 120, one or more tools 122, and, optionally, a shroud 124. FIG. 5 is a perspective view of tool assembly 104 with shroud 124 removed. FIG. 6 is a perspective view of tool assembly 104 with carrier 133. FIG. 7 is an exploded perspective view of tool assembly 104 with shroud 124 removed. Epicyclic gear system 120 is configured to be rotatably coupled to motor 102. Tools 122 are configured to be rotatably coupled to the epicyclic gear system 120. In the illustrated implementation, shroud 124 at least partially surrounds epicyclic gear system 120 and tools 122 and is coupled to epicyclic gear system 120. Shroud 124 defines a receiving hole 126 configured to receive output shaft 112 such that output shaft 112 is coupled to epicyclic gear system 120.

Epicyclic gear system 120 includes sun gear 128, planetary gears 130, and ring gear 132. Epicyclic gear system 120 may also include carrier 133 (shown in FIG. 6). In the illustrated implementation, epicyclic gear system 120 includes three planetary gears 130. However, epicyclic gear system 120 may include any number of planetary gears that enables operation of epicyclic gear system 120 as described herein. In some implementations, output shaft 112 is rotatably coupled to sun gear 128. Sun gear 128 is configured to engage planetary gears 130 through a plurality of complementary sun gear teeth 134 and a plurality of complementary planet gear teeth 136 circumferentially spaced about a radially outer periphery of sun gear 128 and a radially outer periphery of planetary gears 130 respectively. Planetary gears 130 may be maintained in a position relative to each other using carrier 133. Planetary gears 130 are configured to engage ring gear 132 through a plurality of complementary ring gear teeth 138 and complementary planet gear teeth 136 circumferentially spaced about a radially inner periphery of ring gear 132 and a radially outer periphery of planetary gears 130 respectively. As such, sun gear 128 is rotationally coupled to planetary gears 130, and planetary gears 130 are rotationally coupled to ring gear 132. In the illustrated implementation, ring gear 132 is coupled to shroud 124.

Epicyclic gear system 120 can be configured in three configurations: planetary, star, and solar. In the planetary configuration, ring gear 132 remains stationary while sun gear 128 and planetary gears 130 rotate. Output shaft 112 drives sun gear 128 which rotates planetary gears 130 and tools 122.

In the star configuration, carrier 133 maintains planetary gears 130 in position relative to each other. Carrier 133 remains stationary while sun gear 128 and ring gear 132 rotate. Output shaft 112 drives sun gear 128 which is configured to rotate planetary gears 130. Planetary gears 130 are configured to rotate ring gear 132 and carrier 133 is fixedly coupled to shroud 124. Carrier 133 maintains planetary gears 130 positioning while allowing planetary gears 130 to rotate. Ring gear 132 is rotationally coupled to tools 122. Sun gear 128 and ring gear 132 rotate in opposite directions.

In the solar configuration, sun gear 128 remains stationary while planetary gears 130, ring gear 132, and carrier 133 rotate. Output shaft 112 can drive either the ring gear 132 or carrier 133. When output shaft 112 is coupled to carrier 133, planetary gears 130 are configured to rotate ring gear 132 which rotates tools 122. Ring gear 132 and carrier 133 rotate in the same direction. In the solar configuration where output shaft 112 is coupled to ring gear 132, ring gear 132 is configured to rotate planetary gears 130 and carrier 133. Carrier 133 rotates tools 122. Ring gear 132 and carrier 133 rotate in the same direction.

In the illustrated implementation, tools 122 are coupled to planetary gears 130 and epicyclic gear system 120 is configured in the planetary configuration. However, tools 122 may be coupled to any part of epicyclic gear system 120, and epicyclic gear system 120 may be configured in any configuration that enables tool assembly 104 to operate as described herein.

In the illustrated implementation, tools 122 are a plurality of rollers 140 coupled to epicyclic gear system 120. Specifically, each roller 140 of plurality of rollers 140 each includes a first end 142 and a second end 144, and first end 142 is coupled to planetary gears 130. More specifically, in the illustrated implementation, rollers 140 are a plurality of paint rollers 140 each rotatably coupled to planet gears 130. Planetary gears 130 are configured to rotate rollers 140 as planetary gears 130 rotate about sun gear 128. However, tools 122 are not limited to rollers 140. Rather, tools 122 may include any rotatable tool, such as, without limitation, buffing and/or polishing tools, screw drivers, drills, machining tools, and/or any tool that rotates. When tools 122 are not rollers 140, tools 122 may be coupled to any part of epicyclic gear system 120, and epicyclic gear system 120 may be configured in any configuration that enables tools 122 to operate as designed. For example, tools 122 may be a single buffing and/or polishing tool that is coupled to carrier 133 while epicyclic gear system 120 is configured in the planetary configuration.

In the illustrated implementation, shroud 124 at least partially surrounds epicyclic gear system 120 and is coupled to ring gear 132. Specifically, ring gear 132 is coupled to an inner surface 146 of shroud 124 such that ring gear 132 remains stationary. Shroud 124 includes a nozzle 148 configured to receive a conduit 150. Conduit 150 is configured to channel a flow of coating material to nozzle 148, and nozzle 148 is configured to apply the coating material to rollers 140. Specifically, in the illustrated implementation, nozzle 148 is configured to drip coating material onto rollers 140. In alternative implementations, nozzle 148 is configured to spray coating material onto rollers 140. Push-button 108 is configured to activate the flow of coating material from the source of coating material through conduit 150 to nozzle 148. Shroud 124 is configured to prevent the coating material from flying off rollers 140 by surrounding rollers 140 such that if the coating material flies off of rollers 140, it flies into shroud 124 rather than the operator or other part of the manufacturing facility. In alternative implementations, shroud 124 may not include nozzle 148. Rather, coating material is channeled to rollers 140 through a plurality of channels (not shown) within output shaft 112, planetary gears 130, rollers 140, and/or carrier 133. Shroud 124 may not be needed in applications where paint and/or primer is not being applied, such as, but not limited to, buffing, polishing, and/or drilling.

In the illustrated implementation, tool assembly 104 is made of a disposable material, such as plastic, such that tool assembly 104 is a disposable tool assembly 104. Specifically, once tool assembly 104 has been used to coat fastener 206 with the coating material, an operator can remove tool assembly 104 from motor 102 and install a new tool assembly 104 on motor 102. Additionally, tools 122 may also be constructed of a disposable material and/or a flexible material, such as plastic. For example, rollers 140 may include a roller frame (not shown) constructed of plastic and configured to be flexible and/or malleable such that rollers 140 flex or deform around fastener 206. Rollers 140 may also include a roller cover 152 stretched around the roller frame. Roller cover 152 is constructed of an absorbent material configured to absorb the coating material and transfer the coating material to fastener 206. Specifically, roller cover 152 may be a foam material or a nap material consisting of raised hairs, threads, or similar small projections on the surface of fabric or suede. Roller cover 152 is also flexible and/or malleable and configured to at least partially deform around fasteners 206.

During operations, an operator installs tool assembly 104 on motor 102 by inserting output shaft 112 into receiving hole 126 of shroud 124. The operator rotatably attaches output shaft 112 to sun gear 128. The operator also attaches shroud 124 to coupling collar 114, attaches conduit 150 to nozzle 148 and the source of coating material, and attaches a hose to hose connector 110 and a source of compressed air. The operator then positions tool assembly 104 over fastener 206 such that rollers 140 surround fastener 206 as indicated by arrow 212. Rollers 140 deform and flex around fasteners 206 such that the entire fastener 206 is painted by rollers 140. The operator then presses push-button 108 which activates motor 102 and simultaneously activates the flow of coating material from the source of coating material to nozzle 148 through conduit 150. Nozzle 148 drips the coating material on rollers 140 such that rollers 140 are coated with coating material. Activating motor 102 rotates output shaft 112 which rotates sun gear 128. Sun gear 128 rotates planetary gears 130 which rotate rollers 140 around fasteners 206. The rotating rollers 140 transfer the coating material onto fasteners 206 such that fasteners 206 are completely covered by the coating material. As such, rotatable tool assembly 100 described herein provides an efficient and cost effective method for priming and/or painting plurality of fasteners 206 on large machines.

Once the operator has completely coated a first fastener 206 of plurality of fasteners 206, the operator positions tool assembly 104 over a second fastener 206 and repeats the process described above. Once all of fasteners 206 have been coated, the operator may remove tool assembly 104 from motor 102 and install a new tool assembly 104 on motor 102 with a different tool 122 to perform a different task. The operator may then dispose of the used tool assembly 104. Alternatively, the operator may keep and clean the used tool assembly 104 for future use. As such, rotatable tool assembly 100 described herein provides an efficient and cost effective method for performing a variety of tasks with a single motor 102 and multiple, interchangeable tool assemblies 104.

Figure 8:
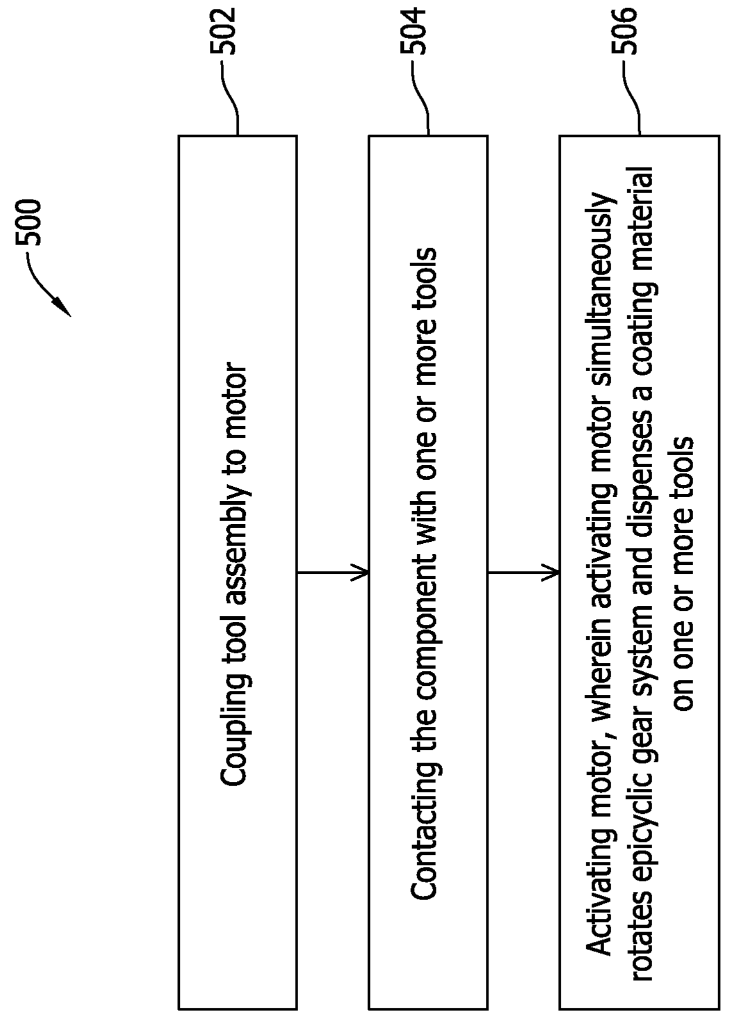
FIG. 8 is a flow diagram of an example of a method of coating a fastener with a rotatable tool.

FIG. 8 is a diagram of a method 500 of coating a component with rotatable tool assembly 100. Method 500 includes coupling 502 tool assembly 104 to motor 102. Method 500 also includes contacting 504 the component with one or more tools 122. Method 500 further includes activating 506 motor 102, wherein activating motor 102 simultaneously rotates epicyclic gear system 120 and dispenses a coating material on one or more tools 122.

The above described examples of the systems described herein include a rotatable tool for performing tasks with rotatable tools. The rotatable tool includes a motor and a tool assembly operatively coupled to the motor. The tool assembly includes an epicyclic gear system including a sun gear, a plurality of planet gears, and a ring gear. The tool assembly also includes one or more tools operatively coupled to the epicyclic gear system. The tool assembly is designed to be replaceable and disposable such that the motor can operate a plurality of tool assemblies with different tools. For example, the tools may be buffing and/or polishing tools, screw drivers, drills, and/or any tool that rotates. In an implementation, the one or more tools are one or more rollers coupled to the epicyclic gear system and configured to coat a component with paint and/or primer. Specifically, the rotatable tool is configured to coat fasteners with a paint and/or primer. Each roller is coupled to a planet gear such that the planet gears rotate the rollers as the motor rotates the epicyclic gear system. The tool assembly further includes a shroud at least partially surrounding the epicyclic gear system and the tools. A coating material, such as the primer or paint, is channeled to the shroud and is applied to the rollers by a nozzle positioned within the shroud. An operator positions the rotatable tool such that the rollers surround the fastener. The operator then activates the motor which rotates the rollers around the fastener. Activating the motor simultaneously activates the flow of coating material to the nozzle and to the rollers such that the coating material quickly coats the rollers and the fastener. As such, the rotatable tool provides an efficient and cost effective method for coating a plurality of fasteners on large machines, such as aircraft. When used with tools other than the rollers, the rotatable tool provides an efficient and cost effective method for operating a tool that rotates.

The systems and methods described herein are not limited to the specific examples described herein, but rather, components of the systems and/or steps of the methods may be utilized independently and separately from other components and/or steps described herein.

Although specific features of various examples of the disclosure may be shown in some drawings and not in others, this is for convenience only. In accordance with the principles of the disclosure, any feature of a drawing may be referenced and/or claimed in combination with any feature of any other drawing.

As used herein, an element or step recited in the singular and proceeded with the word “a” or “an” should be understood as not excluding plural elements or steps unless such exclusion is explicitly recited. Furthermore, references to “one example” of the present disclosure or “an example” are not intended to be interpreted as excluding the existence of additional examples that also incorporate the recited features.

This written description uses examples to disclose various implementation, which include the best mode, to enable any person skilled in the art to practice those implementations, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A rotatable tool assembly comprising:
a motor;
a tool assembly operatively coupled to the motor, the tool assembly comprising:
an epicyclic gear system rotatably coupled to the motor;
one or more tools rotatably coupled to the epicyclic gear system, wherein the motor is configured to rotate the epicyclic gear system, and the epicyclic gear system is configured to rotate the tool; and
a shroud at least partially surrounding the epicyclic gear system and the one or more tools;
a source of a coating material; and
a conduit coupled to the source of the coating material, wherein the conduit is coupled to the shroud and channels the coating material to the shroud.

2. The rotatable tool assembly of claim 1, wherein the epicyclic gear system comprises a sun gear, a plurality of planet gears, and a ring gear, wherein the sun gear is rotationally coupled to the plurality of planet gears, and the plurality of planet gears are rotationally coupled to the ring gear.

3. The rotatable tool assembly of claim 2, wherein the one or more tools is a plurality of tools each coupled to a planet gear of the plurality of planet gears.

4. The rotatable tool assembly of claim 3, wherein the plurality of tools includes a plurality of rollers.

5. The rotatable tool assembly of claim 4, wherein each roller of the plurality of rollers has a first end and a second end, wherein the first end of each roller of the plurality of rollers is coupled to a planet gear of the plurality of planet gears such that the roller rotates with the planet gear.

6. The rotatable tool assembly of claim 2, wherein the sun gear is rotationally coupled to the motor.

7. The rotatable tool assembly of claim 1, wherein the motor is a pneumatic motor.

8. The rotatable tool assembly of claim 7, further comprising a source of compressed air configured to power the pneumatic motor.

9. The rotatable tool assembly of claim 1, wherein the shroud includes a nozzle coupled to the conduit and configured to apply the coating material to the one or more tools.

10. A disposable tool assembly removably coupled to a motor, the disposable tool assembly comprising:
an epicyclic gear system;
one or more tools rotatably coupled to the epicyclic gear system, wherein the epicyclic gear system is configured to rotate the one or more tools; and a shroud at least partially surrounding the epicyclic gear system and the one or more tools, the shroud includes a nozzle for applying a coating material to the one or more tools.

11. The disposable tool assembly of claim 10, wherein the epicyclic gear system and the one or more tools are made of plastic.

12. The disposable tool assembly of claim 10, wherein the epicyclic gear system comprises a sun gear, a plurality of planet gears, and a ring gear, wherein the sun gear is rotationally coupled to the plurality of planet gears, and the plurality of planet gears are rotationally coupled to the ring gear.

13. A method of coating a component with a rotatable tool assembly, the rotatable tool assembly including a motor and a tool assembly, the tool assembly including an epicyclic gear system rotatably coupled to the motor, one or more tools rotatably coupled to the epicyclic gear system, and a shroud at least partially surrounding the epicyclic gear system and the one or more tools, the shroud includes a nozzle configured to apply a coating material to the one or more tools, the method comprising:

coupling the tool assembly to the motor;

contacting the component with the one or more tools;

activating the motor, wherein activating the motor simultaneously rotates the epicyclic gear system;

channeling a coating material to the nozzle; and dripping the coating material on the one or more tools.

14. The method of claim 13 further comprising disconnecting the tool assembly from the motor.

15. The method of claim 14 further comprising disposing of the tool assembly.

16. The method of claim 15 further comprising coupling a second tool assembly to the motor.

17. The rotatable tool assembly of claim 1, wherein the epicyclic gear system, the shroud, and the one or more tools are made of plastic.

18. The rotatable tool assembly of claim 1, wherein the epicyclic gear system, the shroud, and the one or more tools are disposable.

* * * * *